United States Patent [19]
Takata

[11] Patent Number: 5,355,011
[45] Date of Patent: Oct. 11, 1994

[54] INSULATED GATE FIELD EFFECT TRANSISTOR HAVING LDD STRUCTURE AND METHOD OF MAKING THE SAME INCLUDING A CHANNEL STOP HAVING A PEAK IMPURITY CONCENTRATION, THE CHANNEL STOP PROVIDED BELOW A CHANNEL REGION

[75] Inventor: Osamu Takata, Yokohama, Japan
[73] Assignee: Kabushiki Kaisha Toshiba, Kawasaki, Japan
[21] Appl. No.: 90,934
[22] Filed: Jul. 14, 1993
[30] Foreign Application Priority Data
  Jul. 15, 1992 [JP] Japan .................. 4-210927
[51] Int. Cl.$^5$ .............. H01L 29/76; H01L 29/94; H01L 31/062; H01L 31/113
[52] U.S. Cl. .................. 257/408; 257/344; 257/345; 257/400
[58] Field of Search .............. 257/408, 409, 404, 398, 257/399, 400, 344, 394, 345

[56] References Cited
FOREIGN PATENT DOCUMENTS
2-148852 6/1990 Japan ........................... 257/398

*Primary Examiner*—Steven Ho Yin Loke
*Attorney, Agent, or Firm*—Finnegan, Henderson, Farabow & Dunner

[57] ABSTRACT

Insulated Gate Field Effect Transitor (IGFET) having a reduced channel length without deteriorating an electric field relief effect includes a channel stop, located below a channel region, having a peak impurity concentration. A depth of the peak impurity concentration from the substrate surface is deeper than a bottom surface of source and drain regions that provides an Lightly Doped Drain structure.

3 Claims, 6 Drawing Sheets

INSULATED GATE FIELD EFFECT TRANSISTOR HAVING LDD STRUCTURE AND METHOD OF MAKING THE SAME INCLUDING A CHANNEL STOP HAVING A PEAK IMPURITY CONCENTRATION, THE CHANNEL STOP PROVIDED BELOW A CHANNEL REGION

BACKGROUND OF THE INVENTION

1. Field of the Invention

The present invention relates to an insulated gate field effect transistor having an LDD (Lightly Doped Drain) structure and further having a high breakdown voltage and a method of making the same.

2. Description of the Related Art

In an insulated gate field effect transistor (IGFET), an inverted region called a channel is provided between source and drain regions at a surface portion of a semiconductor substrate which contacts a gate insulating film, and the channel is used as a current path between the source and drain regions. With a fine device structure, the channel length of the IGFET is greatly reduced. As the channel length is decreased, various influences such as a decrease in threshold voltage (Vth), a leakage current generated by a punch-through phenomenon in a sub-threshold region, and variations in characteristics caused by hot carriers occur. In order to eliminate the above disadvantages, an LDD structure has been adopted. According to the LDD structure, a lightly doped region is provided so as to contact heavily doped source and drain regions or a heavily doped drain region.

With the above structure, a peak field strength of a drain depletion layer formed under a pinch-off condition can be relieved. The punch-through phenomenon is a phenomenon in which a current flows through the semiconductor substrate when the depletion layer of the drain region is brought into contact with the depletion layer of the source region, and the punch-through phenomenon increases a leakage current. More specifically, the phenomenon is not preferable for transistors such as transfer transistors in DRAMs or CMOS inverters which are easily affected by the leakage current. In order to prevent the punch-through phenomenon, it is effective that an impurity is ion-implanted into the semiconductor substrate such that a peak concentration position is located near the deepest portion of the source/drain regions in the depth direction of the semiconductor substrate. That is, a channel stop (deep channel region) is provided below the channel region by an impurity.

FIG. 10A is a sectional view showing an N-channel IGFET having a conventional LDD structure.

A P-type semiconductor substrate having an impurity concentration of, e.g., about $1 \times 10^{15}$ cm$^{-3}$ is used as a semiconductor substrate 10, and a gate insulating film 2 is provided on the major surface of the semiconductor substrate 10. The gate insulating film, i.e., a gate oxide film, is formed by thermal oxidation or CVD techniques, and is constituted by a silicon oxide film (SiO$_2$) having a thickness of about 1,000 to 2,000Å. A gate electrode 1 of polysilicon or the like having a thickness of about 4,000Å and a gate length L of about 5 μm is formed over the gate insulating film 2. N-type source/drain regions 3 and 4 are formed in the semiconductor substrate 10 below the gate electrode 1. The source region 3 is provided by a low concentration impurity region (to be referred to as a lightly doped region hereinafter) 31 and a high concentration impurity diffusion region (to be referred to as a heavily doped region hereinafter) 32, and the drain region 4 is also constituted by a lightly doped region 41 and a heavily doped region 42, thereby providing an LDD structure. The lightly doped regions 31 and 41 are opposed to each other through a channel region (shallow channel region), and partially extends below the gate electrode 1. Although the heavily doped regions 32 and 42 are formed in the lightly doped regions 31 and 41, respectively, the heavily doped regions 32 and 42 from the substrate surface are deeper than the lightly doped regions 31 and 41.

A channel region 5 is provided in the semiconductor substrate 10 below the gate electrode 1 located between the lightly doped regions 31 and 41, and an effective channel length $L_{eff}$ of the channel region 5 is about 3 μm. In order to improve the punch-through resisting property, a channel stop 6 is provided below the channel region 5. An impurity concentration profile of the channel stop 6 in the depth direction (XB—XB sectional) of the semiconductor substrate 10 is shown in FIG. 10B. The peak impurity concentration of the channel stop 6 is about $1 \times 10^{16}$ cm$^{-3}$. An impurity concentration profile of the channel stop 6 in the horizontal direction of the semiconductor substrate 10 is almost constant, but an impurity concentration profile of the channel stop 6 in the depth direction of the semiconductor substrate 10 has the peak concentration (about $1 \times 10^{16}$ cm$^{-3}$) at an almost central portion of the width in the depth direction. The depth position (about 0.4 μm) having the peak concentration is almost equal to that of the deepest portion of the lightly doped regions 31 and 41 in the source/drain regions. The depth of each of the lightly doped regions 31 and 41 is about 0.35 μm, and the peak concentration is about $1 \times 10^{17}$ cm$^{-3}$. Since the depth of the peak impurity concentration of the channel stop 6 is almost equal to each of that of the bottom of each of the lightly doped regions 31 and 41, the channel stop 6 partially overlaps the lightly doped regions 31 and 41.

The channel region and channel stop of the IGFET are generally formed by ion-implantation techniques. A deep ion-implantation for preventing the punch-through is accomplished to provide the channel stop, while a shallow ion-implantation for controlling a threshold value is carried out to form the channel region. These ion-implantation processes are performed to an element forming region surrounded by an isolation region formed in the semiconductor substrate, and then source/drain regions are provided. However, as in the present invention, when the IGFET having a high breakdown voltage of more than 20 V is required, a difference between the concentration of the lightly doped region of the source/drain regions and the peak impurity concentration of the channel stop is relatively low. Therefore, when the channel stop overlaps the source/drain regions, a predetermined concentration cannot be obtained. Therefore, the channel stop is prevented from overlapping the source/drain regions by using a mask such as a photoresist. However, the channel stop inevitably overlaps the lightly doped source/drain regions.

This is because an alignment margin is determined in consideration of a mask alignment error. In addition, a PN junction of the drain region is shallowly formed in each overlapped portion. For this reason, a field relief effect of the LDD structure can not be obtained, thereby lowering the breakdown voltage and the reliability. Further, in the case of reducing the gate length L, when the effective channel length $L_{eff}$ defined by the gate length is reduced to less than about 3 μm, the breakdown voltage is decreased as indicated by a characteristic curve B in FIG. 2, and the punch-through occurs. Therefore, an IGFET having the effective channel length smaller than about 3 μm cannot be practically used to limit the fine device structure. Although the curve B in FIG. 2 is obtained by using the IGFET having the breakdown voltage of 40 V. However, even if the breakdown voltage is higher or lower than 40 V, the effective channel length of the IGFET having high reliability is limited to about 3 μm as described above. That is, when the breakdown voltage is in the range of 20 to 80 V, the conventional IGFET has the same characteristic as indicated by the characteristic curve B in FIG. 2.

The breakdown voltage shown in FIG. 2 is almost proportional to the thickness of the gate oxide film. That is, an IGFET having the breakdown voltage of 20 V has a gate oxide film having a thickness of about 500Å, and an IGFET having the breakdown voltage of 80 V has a gate oxide film having a thickness of about 2,000Å. The gate oxide film of the IGFET having the breakdown voltage of 40 V shown in FIG. 2 has a thickness of about 1,150Å. In the case of forming the lightly doped region in the source region, when the channel stop overlaps the source region in the depth direction, the width of the lightly doped source region is decreased. For this reason, the source resistance is increased to decrease a current driving force.

SUMMARY OF THE INVENTION

It is, therefore, an object of the present invention to provide an IGFET having an improved field relief effect.

It is another object of the present invention to provide an IGFET having an increased junction breakdown voltage of a drain region.

It is still another object of the present invention to provide an IGFET having a reduced source resistance.

It is still another object of the present invention to provide a method of making an IGFET having an improved LDD structure.

According to one aspect of the present invention, there is provided an IGFET, which comprises a semiconductor substrate of a first conductivity type having a surface, source and drain regions of a second conductivity type provided in the semiconductor substrate to define a channel region therebetween, one of the source and drain regions having a lightly doped region, a gate insulating film provided over the channel region, a gate electrode provided over the gate insulating film, and a channel stop of the first conductivity type, formed below the channel region, having a peak impurity concentration, a depth of the peak impurity concentration from the surface of the semiconductor substrate being deeper than a bottom surface of one of the source and drain regions.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

Embodiments of the present invention will be described below with reference to the accompanying drawings.

Figure 1A:
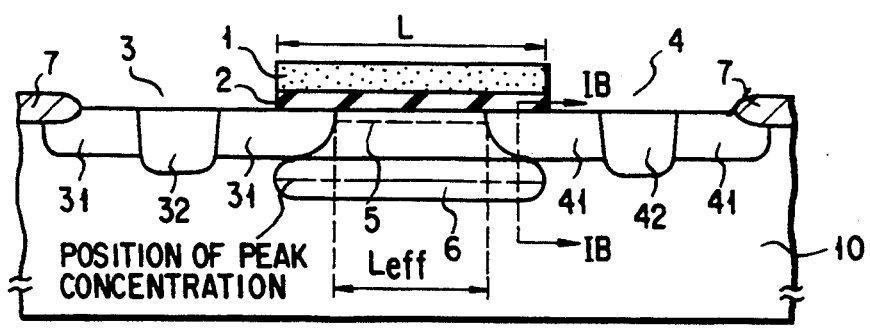
FIG. 1A is a sectional view showing an IGFET having an LDD structure according to a first embodiment of the present invention.
Figure 1B:
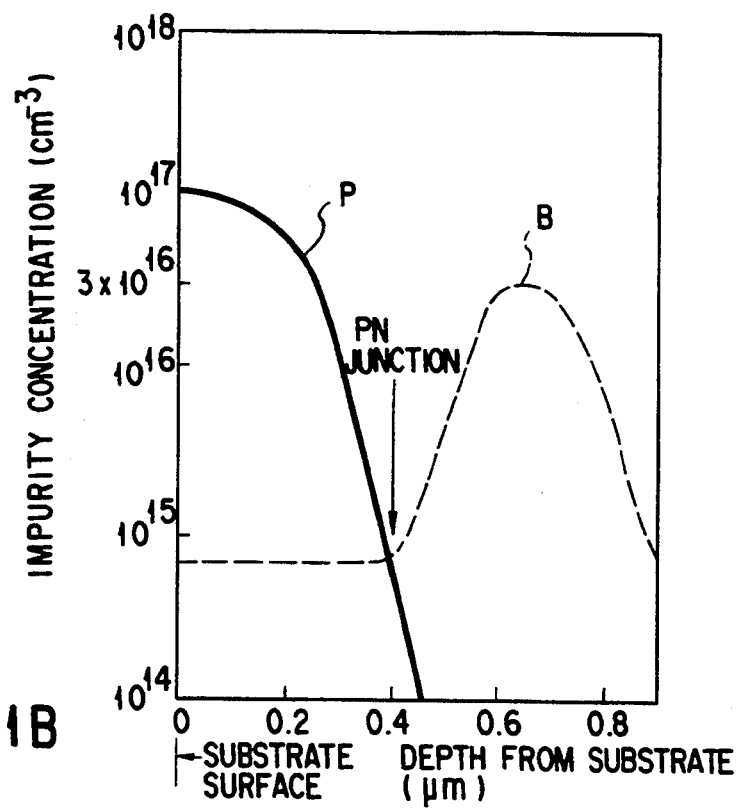
FIG. 1B is a graph showing an impurity concentration profile of a IB—IB section in FIG. 1A.

The first embodiment will be described below with reference to FIGS. 1A and 1B. FIG. 1A is a sectional view showing an N-channel IGFET having an LDD structure applicable to, e.g., CMOS logic circuits. A P-type silicon semiconductor substrate 10 having an impurity concentration of about $7 \times 10^{14}$ cm$^{-3}$ is used as a semiconductor substrate. The resistivity of the semiconductor substrate 10 is about 20 Ωcm. A gate insulating film 2 is formed on the major surface of the semiconductor substrate 10. The insulating film is formed by thermal oxidation or CVD techniques, and is constituted by a silicon oxide film (SiO$_2$) having a thickness of about 1,000 to 2,000Å. In this embodiment, the thickness is about 1,150Å. A gate electrode 1 of polysilicon or the like having a thickness of about 4,000Å and a gate length L of about 4 μm is provided on the gate insulating film 2. Source/drain regions 3 and 4 are formed in the semiconductor substrate 10 so as to be located within the gate electrode 1. The source/drain regions have N$^-$-type lightly doped regions 31 and 41 and N$^+$-type heavily doped regions 32 and 42, respectively, so as to provide an LDD structure.

A channel region 5 having a channel length $L_{eff}$ is formed between the lightly doped regions 31 and 41 located below the gate electrode 1. For example, the channel length $L_{eff}$ is given by about 2.6 μm. A P-type region 6 of the same conductivity type as that of the semiconductor substrate 10 is provided below the channel region 5 as a channel stop. FIG. 1B shows an impurity concentration profile of the channel stop 6 in the depth direction (IB—IB section) from the surface of the semiconductor substrate 10. The peak impurity concentration of the channel stop 6 is about $3 \times 10^{16}$ cm$^{-3}$.

Although the impurity profile of the channel stop 6 in the horizontal direction of the semiconductor substrate 10 is almost constant, the impurity concentration profile in the direction of depth of the semiconductor substrate 10 is not constant. The width direction of the channel stop 6 corresponds to the direction of the depth from the substrate surface, and an almost central portion of the width has a peak concentration (about $3 \times 10^{16}$ cm$^{-3}$). In addition, although the deepest portions (the bottom) of the lightly doped region 31 and 41 of the source/drain regions are located at a position having a depth of about 0.4 μm from the major surface of the semiconductor substrate 10, an upper portion of the channel stop 6, i.e., the shallowest portion of the channel stop 6, does not overlap the bottom of the lightly doped region and almost contact the bottom. The width of the channel stop 6 is about 0.5 μm. The peak concentration of each of the lightly doped regions 31 and 41 is about $1 \times 10^{17}$ cm$^{-3}$. In this manner, unlike the conventional IGFET, the position of the peak impurity concentration of the channel stop 6 is deeper than the bottom of the lightly doped regions 31 and 41 and has a depth of 0.65 μm from the surface of the semiconductor substrate. The impurity concentration of the semiconductor substrate used in the present invention is preferably about $5 \times 10^{14}$ to $1 \times 10^{16}$ cm$^{-3}$, the impurity concentration of each of the heavily doped regions 32 and 42 is preferably about $5 \times 10^{19}$ to $1 \times 10^{21}$ cm$^{-3}$, and the impurity concentration of each of the lightly doped regions 31 and 41 surrounding the heavily doped regions 32 and 42 is preferably about $5 \times 10^{16}$ to $1 \times 10^{17}$ cm$^{-3}$, respectively.

Figure 2:
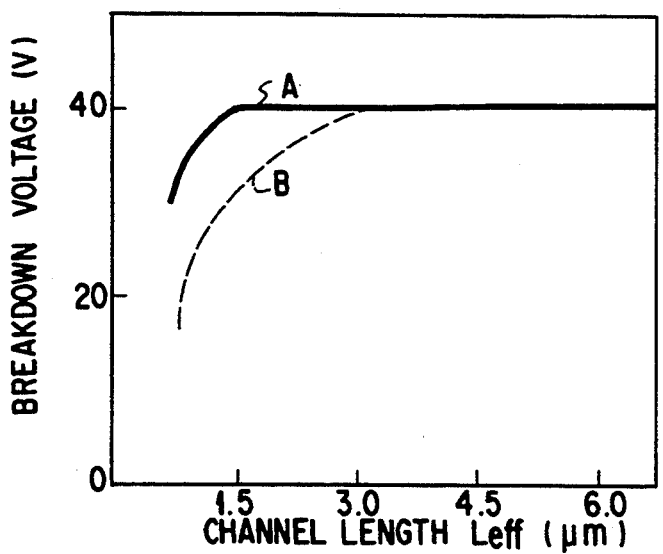
FIG. 2 is a graph showing a relationship between a breakdown voltage and the channel length of the IGFET according to the first embodiment of the present invention.

FIG. 2 is a graph showing a relationship between the channel length $L_{eff}$ and a breakdown voltage. As described in the prior art, when the depth position having the peak impurity concentration of the channel stop 6 is equal to or smaller than that of the deepest portion, i.e., the bottom of the lightly doped regions 31 and 41, as indicated by the curve B, the breakdown voltage (40 V) is decreased if the channel length becomes smaller than about 3 μm. According to the embodiment, the depth position is deeper than the bottom of the lightly doped regions, and the channel stop 6 are located so as not to overlap the lightly doped regions 31 and 41 and to contact them. In this case, as indicated by a curve A, the breakdown voltage characteristic is not degraded until the effective channel length $L_{eff}$ becomes less than about 1.5 μm. When the breakdown voltage is set to be 40 V, the thickness of the gate insulating film 2 corresponds to 1,150Å. When the breakdown voltage is set to be 60 V and 80 V, the thicknesses of the gate oxide films correspond to 1,500Å and 2,000Å, respectively. When the breakdown voltage is set to be 30 V and 20 V, the thicknesses of the gate oxide films correspond to 800Å and 500Å, respectively.

In the IGFET (the thickness of the gate oxide film is 500Å) having the breakdown voltage of 20 V, according to the conventional device, the punch-through occurs when the effective channel length becomes about 3 μm, but according to the present invention, the punch-through does not occur until the effective channel length becomes about 1.5 μm. Similarly, in IGFETs (the thicknesses of gate oxide films are respectively 800Å, 1,500Å, and 2,000Å) respectively having breakdown voltages 30 V, 60 V, and 80 V, according to the conventional device, the punch-through occurs when the effective channel length becomes about 3.0 μm, but according to the present invention, the punch-through does not occur until the effective channel length becomes about 1.5 μm. In any case, when the thickness of the gate insulating film 2 ranges from 500Å to 2,000Å, as in the case wherein the thickness of the gate film is 1,150Å as shown in FIG. 2, the breakdown voltage characteristic is not degraded until the effective channel length becomes about 1.5 μm.

A method of making the IGFET according to the first embodiment will be described below with reference to FIGS. 3A to 3C.

Figure 3A:
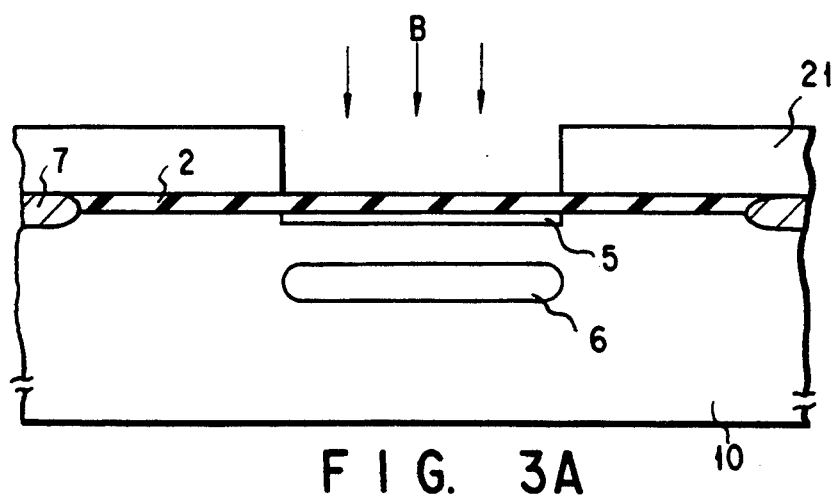
FIGS. 3A to 3C are sectional views showing the steps in making the IGFET according to the first embodiment of the present invention.

As shown in FIG. 3A, the field oxide film 7 is formed in the P$^-$-type semiconductor substrate 10 by LOCOS techniques to define isolation regions. After the silicon oxide film 2 serving as a gate insulating film is formed on the substrate surface, an impurity (boron) is selectively ion-implanted into the semiconductor substrate 10 at about 40 keV using a resist mask 21, thereby forming the channel region 5. Similarly, in order to provide the channel stop 6, an impurity such as boron is ion-implanted at about 160 to 200 keV deeper than the impurity for forming the channel region.

Figure 3B:
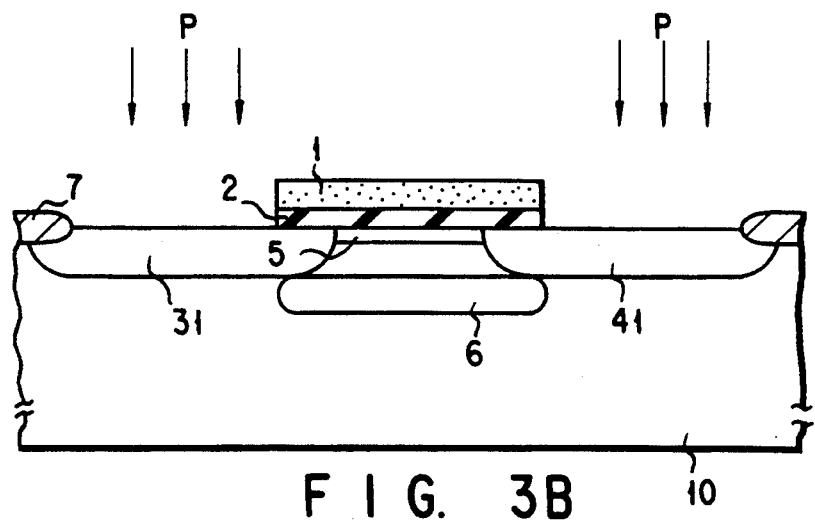

As shown in FIG. 3B, after a polysilicon film is deposited on the semiconductor substrate 10, the gate insulating film 2 and the polysilicon film are selectively etched by using lithography techniques to form the gate electrode 1 on the gate insulating film 2. Thereafter, an impurity (phosphorus) is selectively ion-implanted into the semiconductor substrate 10 to form the lightly doped regions 31 and 41 of the source/drain regions.

Figure 3C:
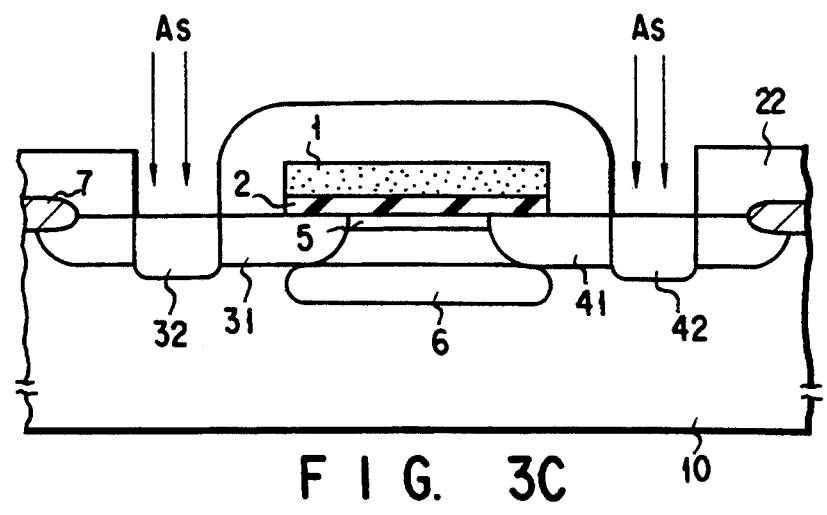

As shown in FIG. 3C, in order to provide the heavily doped regions 32 and 42 of the source/drain regions, an impurity (As) is ion-implanted using a resist mask 22.

Thereafter, annealing is performed to diffuse the ion-implanted impurities, thereby providing the source/drain regions 3 and 4 including the lightly doped regions 31 and 41 and the heavily doped regions 32 and 42, the channel region 5, and the channel stop 6 (see FIG. 1A).

The second embodiment will be described below with reference to FIGS. 4A and 4B.

Figure 4A:
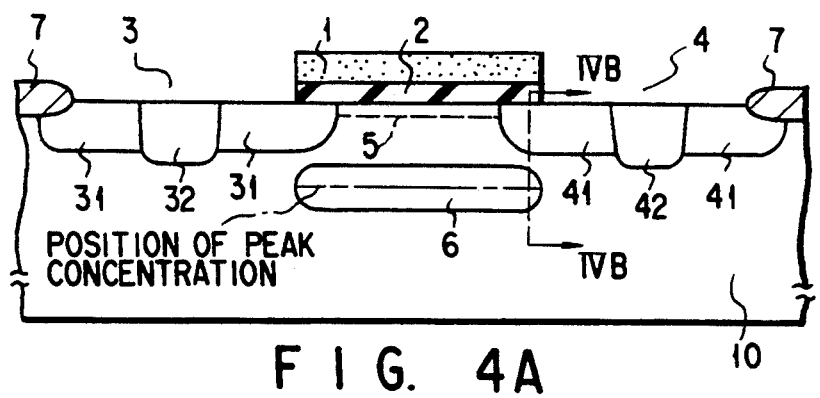
FIG. 4A is a sectional view showing an IGFET having an LDD structure according to a second embodiment of the present invention.
Figure 4B:
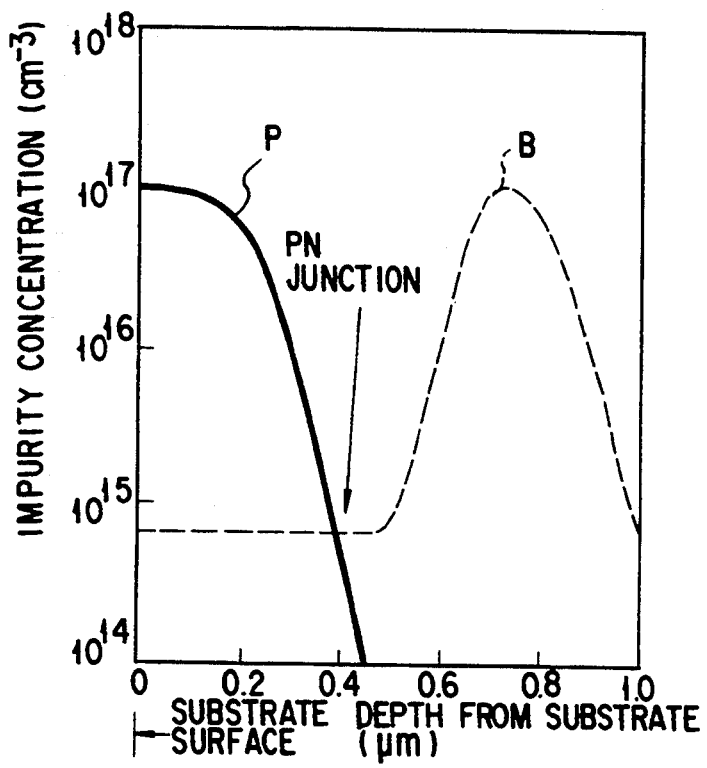
FIG. 4B is a graph showing an impurity concentration profile of a IVB—IVB section in FIG. 4A.

As is apparent from FIGS. 4A and 4B, the structure of the second embodiment is the same as that of the first embodiment except that the position of the peak concentration of the channel stop 6 is different from that in FIG. 1A.

That is, although the deepest portion (the bottom) of lightly doped regions 31 and 41 of source/drain regions has the depth of about 0.4 μm from the substrate surface, the shallowest portion (the upper portion) of the channel stop 6 has the depth of about 0.5 μm from the substrate surface. Therefore, each of the lightly doped regions 31 and 41 is separated from the channel stop 6 by about 0.1 μm. The position of the peak impurity concentration of the channel stop 6 has the depth of 0.75 μm from the substrate surface, and has the width of about 0.5 μm. In this manner, unlike the conventional IGFET, the position having the peak impurity concentration of the channel stop 6 is deeper than the bottom of the lightly doped regions 31 and 41. However, if the depth of the position having the peak impurity concentration is more increased, the effect of preventing the punch-through is reduced. Therefore, in order to maintain the effect indicated by the curve A in FIG. 2, the peak impurity concentration of the channel stop 6 must be higher than that in the first embodiment. If the peak impurity concentration is increased, a depletion layer extends to a portion having a low impurity concentration, thereby suppressing the punch-through between the source/drain regions caused by extension of the depletion layer. In addition, if the impurity concentration is further increased, the effect of increasing the breakdown voltage caused by an LDD structure is decreased. Therefore, the impurity concentration must be decreased as the upper portion of the channel stop 6 becomes closer to the LDD structure.

The third embodiment will be described below with reference to FIGS. 5A and 5B.

Figure 5A:
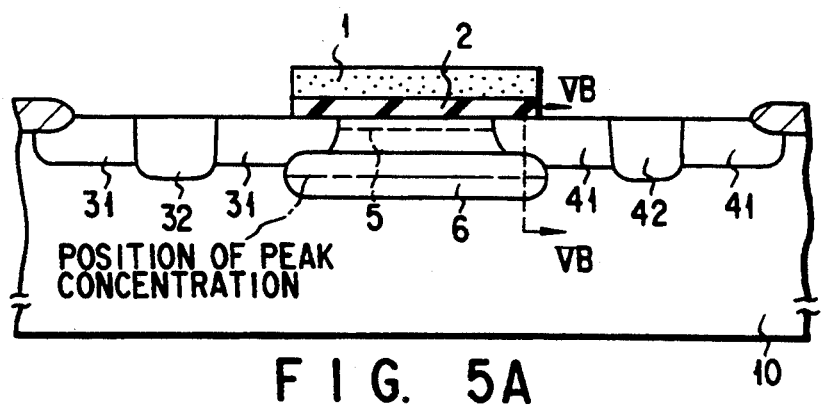
FIG. 5A is a sectional view showing an IGFET having an LDD structure according to a third embodiment of the present invention.
Figure 5B:
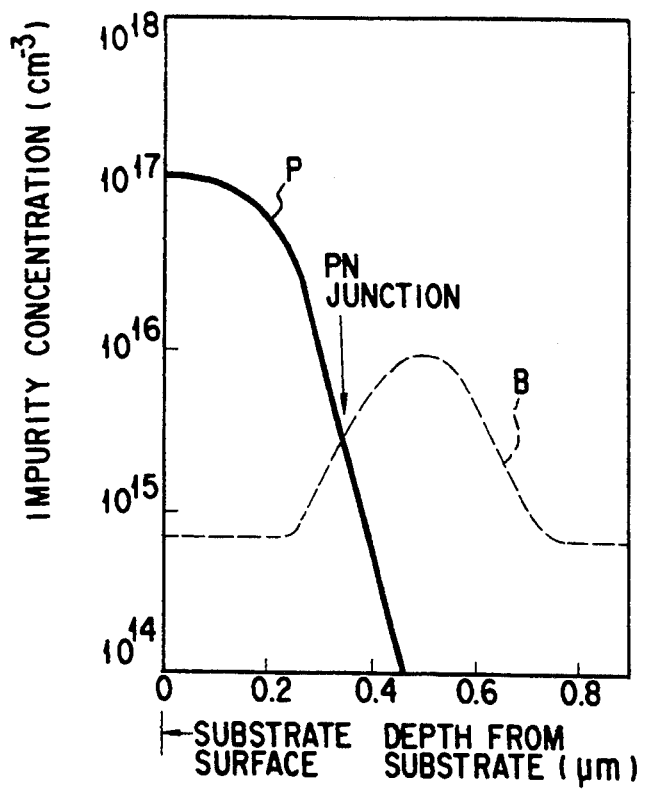
FIG. 5B is a graph showing an impurity concentration profile of a VB—VB section in FIG. 5A.

As is apparent from FIGS. 5A and 5B, the structure of the third embodiment is the same as that of the first embodiment except that part of the channel stop 6 overlaps lightly doped regions 31 and 41 of source/drain regions.

That is, since the channel stop 6 partially overlaps the lightly doped regions 31 and 41 of the source/drain regions, the upper portion of the channel stop 6 is shallower than that of the previous embodiments and has the depth of about 0.35 μm from the substrate surface. The position of the peak impurity concentration of the channel stop 6 has the depth of about 0.5 μm from the substrate surface. The width of the channel stop 6 is about 0.4 μm. In this manner, unlike the conventional IGFET, the position of the peak impurity concentration of the channel stop 6 is deeper than the bottom of the lightly doped regions 31 and 41. In addition, since the channel stop 6 partially overlaps the lightly doped regions 31 and 41, the peak impurity concentration of the channel stop 6 must be lower than that of each of the above embodiments to maintain at least the effect indicated by the curve A in FIG. 2.

Figure 6:
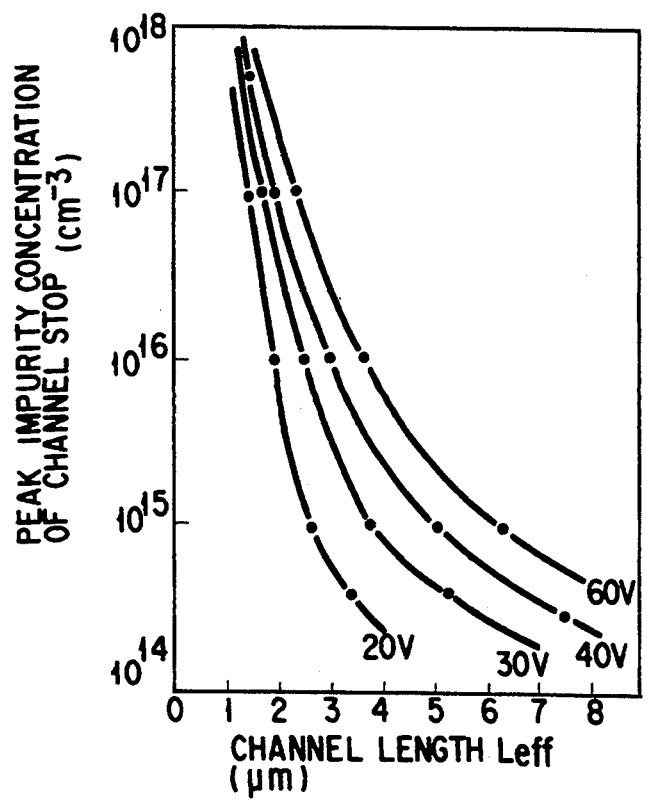
FIG. 6 is a graph showing a relationship between a peak impurity concentration of a channel stop and an effective channel length according to the present invention.

A relationships between the effective channel length $L_{eff}$ required for maintaining breakdown voltages of 20 V, 30 V, 40 V, and 60 V, and the peak impurity concentration of the channel stop at this time in the present invention will be described below with reference to FIG. 6.

The thickness of the gate oxide film of the IGFET is controlled as described above, corresponding to the breakdown voltage. The upper portion of the channel stop contacts the bottom of the lightly doped regions. In FIG. 6, the peak impurity concentration of the channel stop is plotted along the ordinate, and the channel length of the IGFET is plotted along the abscissa. As shown in FIG. 6, in order to maintain the breakdown voltage characteristics shown in FIG. 2 while the effective channel length $L_{eff}$ is decreased, the peak impurity concentration may be increased. For example, in a curve representing a breakdown voltage of 40 V, when the peak impurity concentration of the channel stop is set to be about $4 \times 10^{17}$ cm$^{-3}$, the breakdown voltage characteristic can be stabilized as shown in FIG. 2 even if the channel length $L_{eff}$ is set to be about 1.5 μm. When the channel length is long, the peak impurity concentration may be low. In addition, even if the peak impurity concentration is about $10^{15}$ cm$^{-3}$ or less, breakdown voltage characteristics can be stabilized by decreasing the impurity concentration of the semiconductor substrate.

Figure 7:
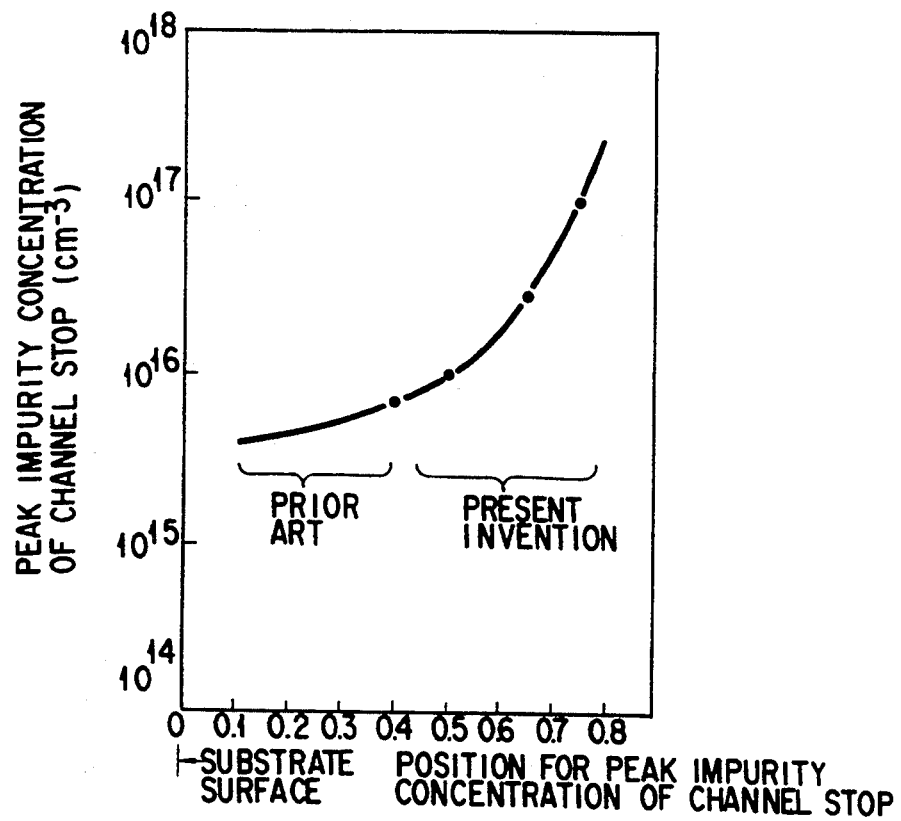
FIG. 7 is a graph showing a relationship between the peak impurity concentration of the channel stop and a substrate depth according to the present invention.

A relationships between the depth position of the peak impurity concentration of the channel stop required for maintaining the breakdown voltage of 40 V, and the optimal peak impurity concentration at this time will be described below with reference to FIG. 7.

It is assumed that the thickness of the gate oxide film of the IGFET is about 1,150Å. In FIG. 7, the peak impurity concentration of the channel stop is plotted along the ordinate, and the depth from the substrate surface is plotted along the abscissa. In order to suppress the influence caused by overlapped portions between the lightly doped regions and the channel stop, the channel stop may be arranged in a deep region of the semiconductor substrate. However, for effectively making use of the characteristics of the channel stop, as the depth of the region is increased, the peak impurity concentration must be increased to maintain the effect of increasing the breakdown voltage by the LDD structure. In the case shown in FIG. 7, when the peak impurity concentration is lower than about $7 \times 10^{15}$ cm$^{-3}$, the effect of preventing the punch-through cannot be sufficiently obtained.

The fourth embodiment will be described below with reference to FIG. 8.

Figure 8:
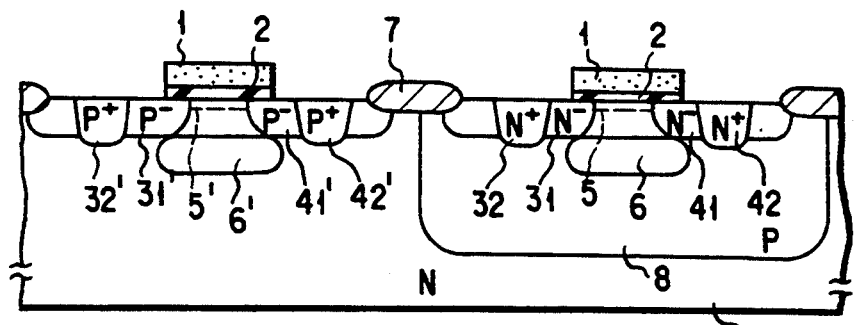
FIG. 8 is a sectional view showing an IGFET having an LDD structure according to a fourth embodiment of the present invention.

FIG. 8 is a sectional view showing an IGFET having an LDD structure according to the present invention. An N$^-$-type semiconductor substrate having an impurity concentration of, e.g., about $7 \times 10^{14}$ cm$^{-3}$ is used as a semiconductor substrate 10, and a well region is formed in the semiconductor substrate 10 to obtain a CMOS structure. The resistivity of the semiconductor substrate 10 is about 20 Ωcm. A P-type well 8 is formed in the semiconductor substrate 10 by ion-implanting, e.g., boron in the semiconductor substrate 10. The impurity concentration of the P-type well 8 is almost ten times as much as the semiconductor substrate. A field oxide film 7 for defining an isolation region is formed on the substrate surface, and gate insulating films 2 each having a thickness of about 1,150Å and formed by, e.g., thermal oxidation, are formed on the semiconductor substrate 10 and the P-type well region 8, respectively. A channel region 5' and a channel stop 6' are provided in the semiconductor substrate 10. These regions are formed by ion-implanting an impurity. In order to form a channel stop 6 in the P-type well region 8, boron is ion-implanted into the P-type well region 8. In addition, in order to form the channel stop 6' in the semiconductor substrate 10, phosphorus is implanted into the semiconductor substrate 10. Lightly doped regions 31 and 41 of source/drain regions are provided in both sides of the channel stop 6, and lightly doped regions 31' and 41' of source/drain regions are also provided in both sides of the channel stop 6', respectively.

In order to provide these lightly doped regions, phosphorus and boron are ion-implanted into the P-type well region 8 and the semiconductor substrate 10, respectively, followed by annealing. The N$^-$-type lightly doped regions 31 and 41 are formed in the P-type well 8, and the P$^-$-type lightly doped regions 31' and 41' are formed in the semiconductor substrate 10. Heavily doped regions 32, 32', 42, and 42' of the source/drain regions are formed to be surrounded by the lightly doped regions 31, 31', 41, and 41', respectively. In order to form the heavily doped regions 32, 32', 42, and 42', arsenic (As) and boron (B) are ion-implanted into the P-type well region 8 and the semiconductor substrate 10, respectively. The N+-type heavily doped regions 32 and 42 are formed in the P-type well region 8, and the P+-type heavily doped regions 32' and 42' are formed in the semiconductor substrate 10. If the oxide film covering the substrate surface is removed from a predetermined region in advance, the ion-implantation of As can be properly performed. A gate electrode 1 is provided over each of the gate insulating films 2. A polysilicon film is deposited over the surface of the semiconductor substrate 10, and is etched by RIE (Reactive Ion Etching) using the lithography technique, thereby providing the polysilicon gate electrodes 1. In this manner, an NMOSFET is provided in the P-type well region 8, and a PMOSFET is formed in the semiconductor substrate 10. In the FETs, the channel stops 6 and 6' contact the lightly doped regions 31, 31', 41, and 41', respectively, and do not overlap them.

In the CMOS structure, the depth position having the peak impurity concentration of the channel stop is deeper than the bottoms of the lightly doped regions in each of the NMOSFET and PMOSFET. Although this arrangement may be applied to only any one of the NMOSFET and PMOSFET, the arrangement is advantageously applied to both FETs effectively to obtain the fine device structures.

The fifth embodiment will be described below with reference to FIG. 9.

Figure 9:
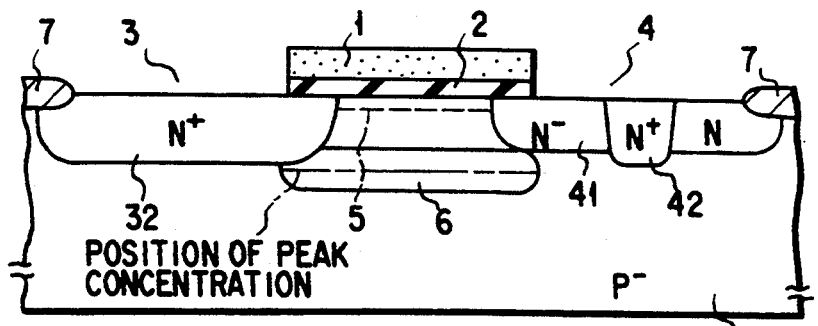
FIG. 9 is a sectional view showing an IGFET having an LDD structure according to a fifth embodiment of the present invention.
Figure 10A:
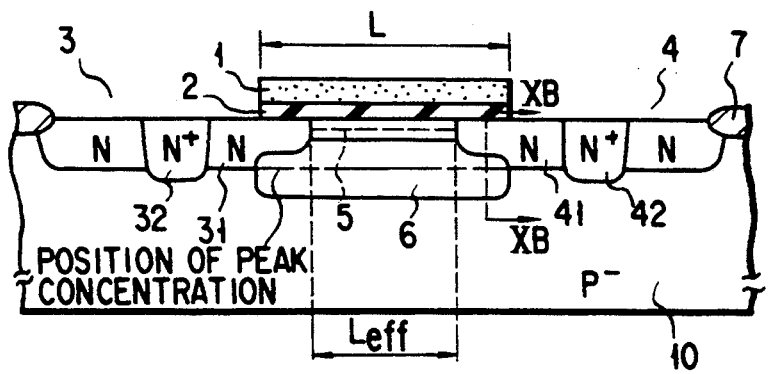
FIG. 10A is a sectional view showing an IGFET having a conventional LDD structure.
Figure 10B:
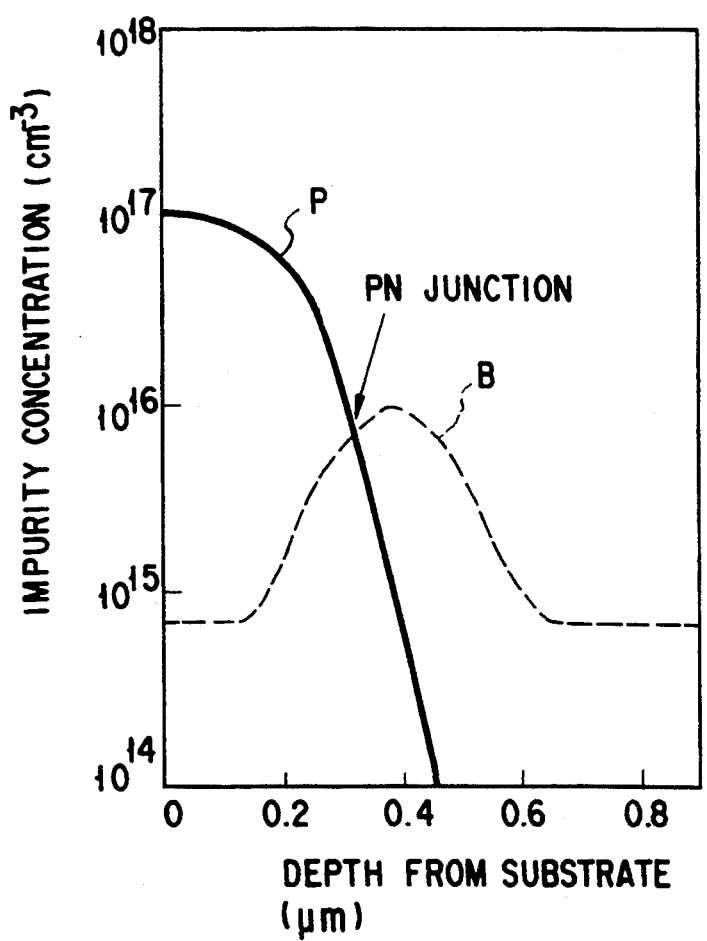
FIG. 10B is a graph showing an impurity concentration profile of XB—XB section in FIG. 10A.

FIG. 9 is a sectional view showing an IGFET having an LDD structure according to the present invention and applicable to CMOS logic circuits or the like. The structure of IGFET is the same as that in the first embodiment shown in FIG. 1A. In the fifth embodiment, since a high voltage is not applied to the source region, the LDD structure is not applied thereto. Therefore, the source region 3 is provided by only the N+-type region 32, while the drain region 4 has the LDD structure constituted by the N+-type heavily doped region 42 and the N--type lightly doped region 41. The channel stop 6 having the high impurity concentration and the same conductivity type as that of the semiconductor substrate 10 is provided below the channel region 5 formed under the gate insulating film 2. The bottom of the lightly doped region 41 in the drain region has a depth almost equal to the upper portion of the channel stop 6. That is, the lightly doped region 41 contacts the channel stop 6, and does not overlap the channel stop 6. According to the structure, the same breakdown voltage characteristic as shown in FIG. 2 is obtained.

As has been described above, it is very difficult to provide an IGFET having an effective channel length of less than about 3 $\mu$m and a breakdown voltage of above 20 V by the conventional technique. However, according to the present invention, an IGFET having an effective channel length of about 1.5 to 2.0 $\mu$m, high reliability, and a high breakdown voltage of more than 20 V without causing a punch-through phenomenon can be provided. The conductivity type of a semiconductor substrate is not limited, and an N-type or P-type semiconductor substrate may be used. An epitaxial layer grown on a semiconductor substrate surface may be used as a semiconductor substrate. Although the polysilicon gate is illustrated as the gate electrode, a silicide gate may be used as the gate electrode, and a gate material such as a polycide gate composed of polysilicon and silicide which is normally used can be applied thereto. A MOS transistor according to the present invention can be used for CMOS or BiCMOS circuits. When the MOS transistors are used for liquid crystal drivers having a breakdown voltage of 60 V, their sizes are greatly decreased because the semiconductor device having high integration density is obtained.

As has been described above, the junction depth of the LDD structure near the gate end can be increased because the LDD structure is not hindered by the channel stop. As a result, the field relief effect of the LDD structure can be improved to increase the junction breakdown voltage of the drain region. The field relief effect can be sufficiently maintained even if the effective channel length is decreased. The integration density of the semiconductor device can be then more increased. In addition, when the source region has the LDD structure, the junction depth of the LDD structure can be increased. Therefore, the source resistance can be reduced to increase the current driving force.

It is further understood by those skilled in the art that the foregoing description is only of the preferred embodiments and that various changes and modifications may be made in the invention without departing from the spirit and scope thereof.

What is claimed is:

1. A semiconductor device having an Lightly Doped Drain structure comprising:
    a semiconductor substrate of a first conductivity type having a surface;
    source and drain regions of a second conductivity type provided in said semiconductor substrate to define a channel region therebetween, one of said source and drain regions having a lightly doped region;
    a gate insulating film provided over said channel region;
    a gate electrode provided over said gate insulating film; and
    a channel stop of said first conductivity type, formed below said channel region, having a peak impurity concentration,
        a depth of said peak impurity concentration from said surface of said semiconductor substrate being deeper than a bottom surface of one of said source and drain regions, and
        said peak impurity concentration being increased as an effective channel length of said channel region is reduced.

2. The semiconductor device according to claim 1, wherein said peak impurity concentration is increased as said depth is increased.

3. The semiconductor device according to claim 1, wherein said depth of said peak impurity concentration of channel stop is deeper than said lightly doped region.

* * * * *

UNITED STATES PATENT AND TRADEMARK OFFICE
CERTIFICATE OF CORRECTION

PATENT NO. : 5,355,011
DATED : October 11, 1994
INVENTOR(S) : Osamu TAKATA

It is certified that error appears in the above-indentified patent and that said Letters Patent is hereby corrected as shown below:

Abstract, title page, line 2, change "Transitor" to --Transistor--.

Signed and Sealed this

Twenty-third Day of May, 1995

Attest:

*Attesting Officer*

BRUCE LEHMAN

*Commissioner of Patents and Trademarks*